(12) United States Patent
Suzumura

(10) Patent No.: US 9,633,145 B2
(45) Date of Patent: Apr. 25, 2017

(54) TRAFFIC SIMULATION METHOD, PROGRAM, AND SYSTEM

(71) Applicant: International Business Machines Corporation, Armonk, NY (US)

(72) Inventor: Toyotaro Suzumura, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 491 days.

(21) Appl. No.: 14/222,733

(22) Filed: Mar. 24, 2014

(65) Prior Publication Data

US 2014/0297243 A1    Oct. 2, 2014

(30) Foreign Application Priority Data

Mar. 27, 2013    (JP) .................. 2013-066420

(51) Int. Cl.
  *G06G 7/48* (2006.01)
  *G06F 17/50* (2006.01)

(52) U.S. Cl.
  CPC ...... *G06F 17/5009* (2013.01); *G06F 17/5095* (2013.01)

(58) Field of Classification Search
  CPC .................... G06F 17/5009; G06F 17/5095
  See application file for complete search history.

(56) References Cited

FOREIGN PATENT DOCUMENTS

| JP | H08249586 A | 9/1996 |
|---|---|---|
| JP | 2004-258889 A | 9/2004 |
| JP | 2008151736 A | 7/2008 |
| JP | 2009-093425 A | 4/2009 |
| JP | 2012146245 A | 8/2012 |

OTHER PUBLICATIONS

Atsuo Ozaki et al., "High performance road traffic simulation based on dynamic time step synchronization method," 2007, 11th IEEE Symposium on Distributed Simulation and Real-Time Applications, pp. 235-243.*
Toyotaro Suzumura et al., "Accelerating Large-Scale Distributed Traffic Simulation with Adaptive Synchronization Method," Oct. 2013, 20th ITS World Congress 2013, Tokyo, Japan, pp. 1-10.*
Decision to Grant a Patent, Application No. 2013-066420. Mar. 4, 2016. Translated Apr. 8, 2016. 3 pages.
JP Office Action; Notification of Reasons for Refusal,Application No. 2013-066420. Jan. 22, 2016. Translated Apr. 8, 2016. 3 pages.

* cited by examiner

*Primary Examiner* — Kamini S Shah
*Assistant Examiner* — Russ Guill
(74) *Attorney, Agent, or Firm* — Stosch Stabo

(57) ABSTRACT

Traffic simulation method, program, and system for automatically determining the value of an appropriate time step of a simulation in a traffic simulation technique. In order to calculate the filling rates of roads, top K intersections are selected from among intersections in a region that is an object of the simulation, for each synchronization timing in terms of the filling rate. For instance, the filling rate is calculated as a filing rate of vehicles on roads directly connected to the intersection. More specifically, the filling rate is calculated by dividing the number of vehicles traveling on each road directly connected to the intersection by the length of the road, and totalizing each quotient. The time step of the simulation is determined as a monotonically decreasing function with respect to the filling rate, preferably, as a value in inverse proportion to the square of the filing rate.

12 Claims, 5 Drawing Sheets

TRAFFIC SIMULATION METHOD, PROGRAM, AND SYSTEM

CROSS-REFERENCE TO RELATED APPLICATION

This application claims priority under 35 U.S.C. §119 from Japanese Patent Application No. 2013-066420 filed Mar. 27, 2013, the entire contents of which are incorporated herein by reference.

BACKGROUND OF THE INVENTION

The present invention relates to a traffic simulation technique. More specifically, the present invention relates to a method, program, and system for simulating vehicles traveling on a road.

There are known computer-based traffic simulation systems. Such systems cause a computer to calculate the movement of each vehicle along a road at each time step and proceed to process the information. For example, according to JP2004258889A, the direction and magnitude of acceleration of a vehicle, in both the case of stopping and the case of traveling, are determined based on both a static potential field (defined by the magnitude of effects of external factors that affect the traveling of the vehicle and are temporally constant) and a dynamic potential field (defined by the magnitude of effects of external factors that affect the traveling of the vehicle and temporally vary). In this case, the width of the time step causes a problem. That is, in order to increase the accuracy of a simulation, the width of the time step must be reduced. This reduction reduces the operation velocity of the simulation system.

In another example, JP200993425A discloses a traffic flow simulation in order to improve the processing efficiency while securing a required accuracy. JP200993425A discloses a traffic flow simulation where a region as an object of the simulation is divided into a plurality of regions and different values of the time steps are assigned to the respective regions. In this case if, after a time step, a moving vehicle enters a region with a different time step, the time and the position at this time (which are in conformity with the time step for the region in which the vehicle enters) are calculated and the simulation is continued. The technique in JP200993425A requires both that the region as an object of the simulation is preliminarily divided and that appropriate values of the time steps are assigned to the respective divided regions. However, it is difficult to set an appropriate value of the time step to any object region.

SUMMARY OF THE INVENTION

The present invention solves the above-mentioned problems by dynamically changing a traffic simulation according to a congestion factor of a road in the traffic simulation. An embodiment of the present invention automatically determines appropriate values of time steps of a simulation in a traffic simulation technique.

A computer implemented traffic simulation method for sequentially calculating the positions of a plurality of vehicles traveling along roads according to a time interval, wherein the computer includes a processor communicatively coupled to a memory, the method including: calculating a filing rate of an at least one vehicle at an intersection; selecting a plurality of top N intersections with respect to the filing rate; adding up a plurality of filing rates with respect to the plurality of top N intersections to get an added-up filing rate; calculating the time interval of a simulation as a monotonically decreasing function of a value of the added-up filing rate to get a calculated time interval; and advancing the simulation at the calculated time interval.

A computer readable storage medium tangibly embodying a computer readable program code having computer readable instructions which, when implemented, cause a computer to carry out the steps of a method for calculating the positions of a plurality of vehicles traveling along roads in a traffic simulation according to a time interval, the method including: calculating a filing rate of an at least one vehicle at an intersection; selecting a plurality of top N intersections with respect to the filing rate; adding up a plurality of filing rates with respect to the plurality of top N intersections to get an added-up filing rate; calculating the time interval of a simulation as a monotonically decreasing function of a value of the added up filing rate to get a calculated time interval; and advancing the simulation at the calculated time interval.

A traffic simulation system for sequentially calculating the positions of a plurality of vehicles traveling along roads according to a time interval, the traffic simulation system including: a memory; a processor communicatively coupled to the memory; and a main program module communicatively coupled to the memory and the processor, wherein the main program module is configured to perform the steps of a method including: calculating a filing rate of an at least one vehicle at an intersection; selecting a plurality of top N intersections with respect to the filing rate; adding up a plurality of filing rates with respect to the plurality of top N intersections to get an added-up filing rate; calculating the time interval of a simulation as a monotonically decreasing function of a value of the added-up filing rate to get a calculated time interval; and advancing the simulation at the calculated time interval.

The present invention optimizes the operation velocity and operation accuracy of the simulation by automatically determining the time steps according to the respective filing rates of vehicles.

DETAILED DESCRIPTION OF THE PREFERRED EMBODIMENT

The present invention solves the above-mentioned problems by dynamically changing a traffic simulation according to a congestion factor of a road in the traffic simulation. An embodiment of the present invention automatically determines appropriate values of time steps of a simulation in a traffic simulation technique.

The system of the present invention, first, in order to calculate a congestion factor of a road (which is a filing rate) selects top K (e.g., K is selected to be 1000) intersections from among intersections in a region that is an object of the simulation, for each synchronization timing in terms of the filling rate. For instance, the filling rate is calculated as a filing rate of vehicles on roads directly connected to the intersection. More specifically, the filling rate is calculated by dividing the number of vehicles traveling on each road directly connected to the intersection by the length of the road and totaling each quotient.

According to the present invention, the time step of the simulation is determined as a monotonically decreasing function with respect to the filling rate, preferably, as a value in inverse proportion to the square of the filing rate.

The present invention optimizes the operation velocity and operation accuracy of the simulation by automatically determining the time steps according to the respective filing rates of vehicles.

A configuration and process of an embodiment of the present invention is described with reference to the accompanying drawings. In the following description, unless otherwise specified, the same element is denoted by the same sign throughout the drawings. The configuration and process described herein are an illustration of an embodiment of the present invention and there is no intention to construe the technical scope of the present invention as a scope limited to this embodiment.

Figure 1:
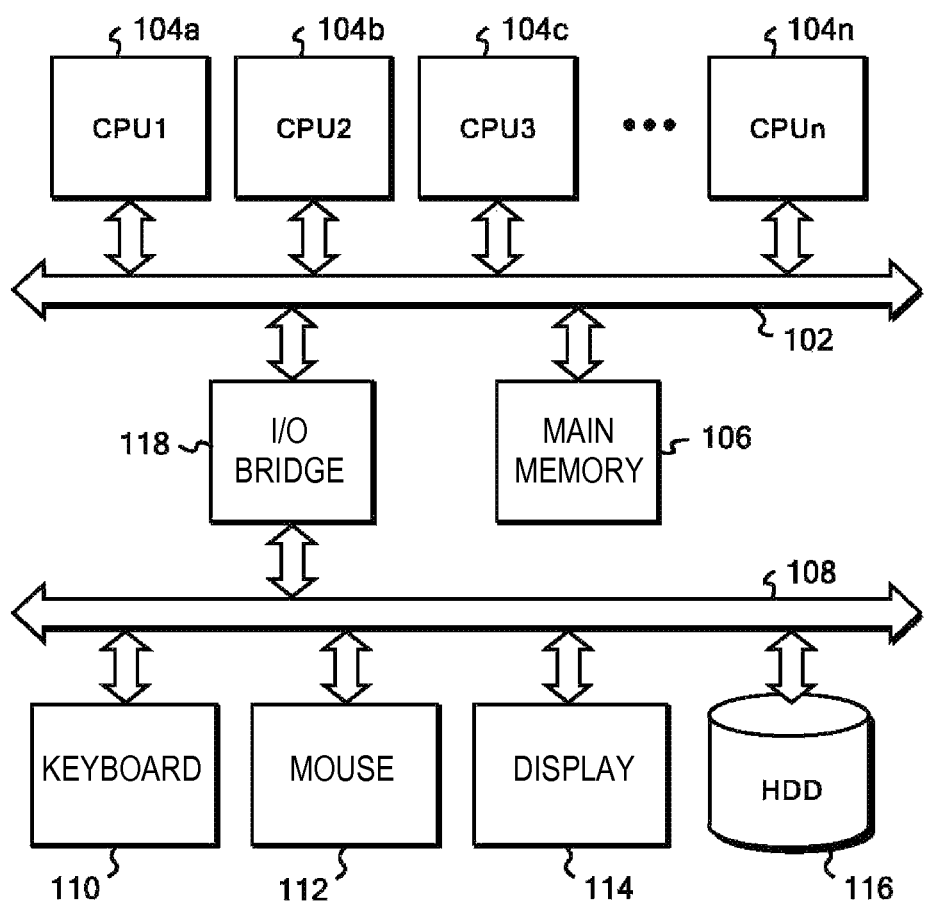
FIG. 1 is a block diagram of a hardware configuration for implementing the embodiments of the present invention.

First, referring to FIG. 1, a hardware configuration of a computer used for implementing the present invention is described. In FIG. 1, a CPU 1 104*a*, a CPU 2 104*b*, a CPU 3 104*c*, . . . , CPU n 104*n* are connected to a host bus 102. Furthermore, a main memory 106 for operation processes of the CPU 1 104*a*, CPU 2 104*b*, CPU 3 104*c*, . . . , CPU n 104*n* is connected to the host bus 102.

A keyboard 110, a mouse 112, a display 114, and a hard disk drive 116 are connected to an I/O bus 108. The I/O bus 108 is connected to the host bus 102 via an I/O bridge 118. The keyboard 110 and the mouse 112 are used for allowing an operator to perform operations, such as input of a command and clicking on a menu. The display 114 is used for displaying a menu for operations of an after-mentioned program according to the present invention through an interface (such as GUI) as required.

Hardware of a preferable computer system can be the IBM® System X. In this case, the CPU 1 104*a*, CPU 2 104*b*, CPU 3 104*c*, . . . , CPU n 104*n* are, for instance, Intel® Xeon® and the operating system is Windows (trademark) Server 2008. The operating system is stored in the hard disk drive 116 and read from the hard disk drive 116 onto the main memory 106 at startup of the computer system.

Use of a multiprocessor system is preferable to implement the present invention. Here, the multiprocessor system is typically intended to be a system having a plurality of processor functions capable of independent operation processing. It should be noted that the system can be any of a multicore single processor system, a single core multiprocessor system, and a multicore multiprocessor system.

A preferable multicore processor can be any of Intel Corporation Core (trademark) i3, Core (trademark) i5, Core (trademark) i7, Xeon®, AMD Inc. Athlon (trademark), Phenom (trademark), Sempron (trademark), and other similar multicore processors.

The hardware of the computer system that can be used for implementing the present invention is not limited to IBM® System X. Any computer system including a personal computer that can execute the simulation program of the present invention can be used. The operating system is not limited to Windows®. Any of operating systems, such as Linux®, and Mac OS x® may be used. In order to execute the simulation program at high speed, a computer system, such as IBM® System P, which is based on POWER (trademark) 6 and has the operating system AIX (trademark).

Furthermore, the hardware of the computer system can be a distributed system that is interconnected via LAN, WAN, and other similar networks.

The hard disk drive 116 further stores a main program 202, map data 204, a traffic simulation program 206, a filling rate calculation routine 208, a sorting routine 210, a routine 212 for calculating the number of steps (which are described later with reference to FIG. 2) and these are loaded onto the main memory 106 and executed in response to operations by the operator on the keyboard 110 and the mouse 112. The files and routines are described later with reference to FIG. 2. The main program 202, the traffic simulation program 206, the filling rate calculation routine 208, the sorting routine 210, the routine 212 for calculating the number of steps can be created by being written as code of existing computer programming languages, such as Java®, C, C++, and C#, and complied by a prescribed compiler.

Figure 2:
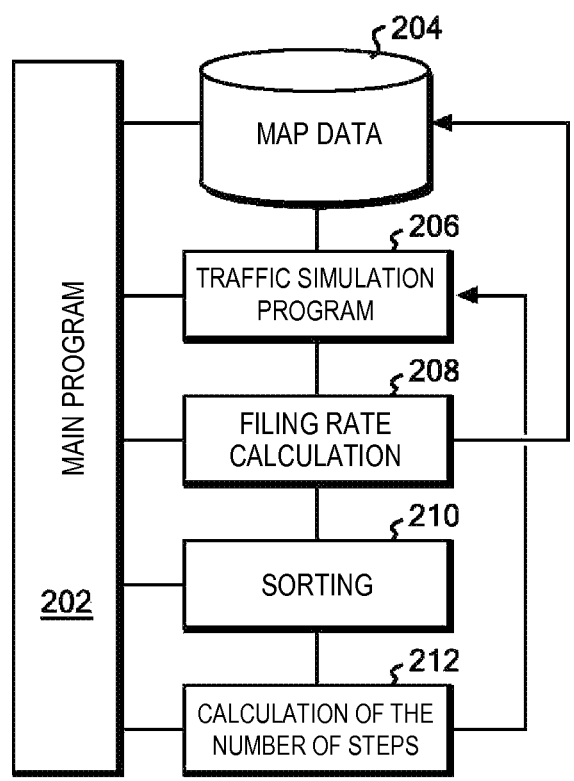
FIG. 2 is a block diagram of a functional configuration for implementing an embodiment of the present invention.

Next, referring to FIG. 2, a functional configuration of an embodiment of the present invention is described. The main program 202 accepts operations by the operator on the keyboard 110 and the mouse 112, and controls the overall processes, which includes startup and stop of the traffic simulation program 206.

In this embodiment of the present invention, the map data 204 can be, but is not limited to, map data acquired from Open Street Map. In particular, in this embodiment, intersections are managed as a set of points. However, if only actual intersections are focused, then points are unfortunately sparse in the case of a long extending road, such as an expressway. Thus, in the case of a long road, the road is separated by an order of several hundred meters and the separations are regarded as extended intersections. In the following description, the actual intersections and the extended intersections are basically dealt with as the same.

Furthermore, according to this embodiment of the present invention, in the map data 204, the set of intersections are divided into a plurality of subsets and each of the subsets is processed by a node that is a separate processing unit. The node described here is a logically divided processing unit. In the configuration shown in FIG. 1, the unit is typically each of individuals of the CPU 104*a*, 104*b*, . . . , 104*n*. Instead, in the case of a distributed processing environment, each of the network-connected computers can be regarded as a node. If the traffic simulation program 206 has such a multinode configuration, communication occurs between different nodes as vehicles move along the road. Accordingly, the nodes are assigned to the intersections so as to reduce the communication traffic as much as possible.

Figure 4:
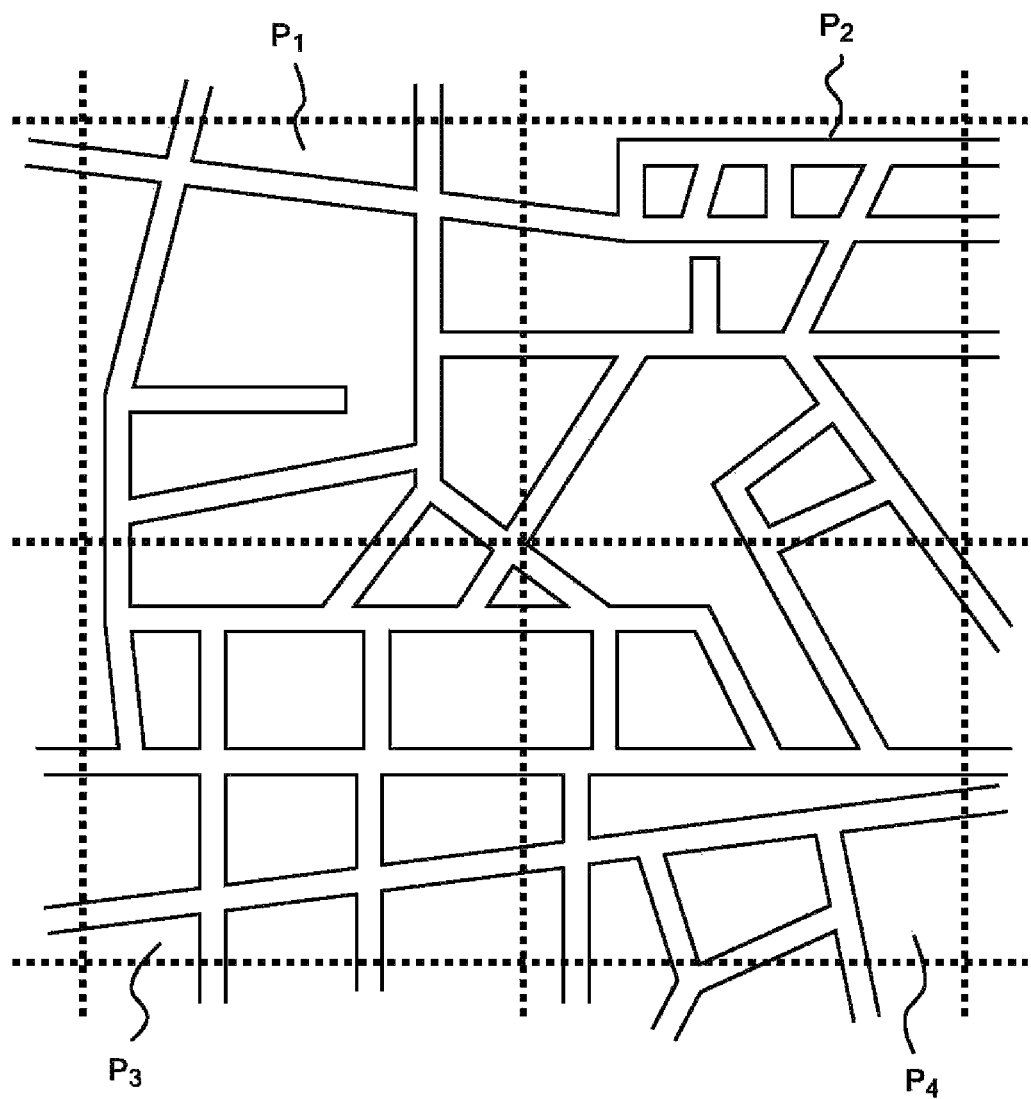
FIG. 4 is a diagram showing division of a map into a plurality of places according to an embodiment of the present invention.

FIG. 4 shows a part of the map data 204 and assignment of intersection data to nodes. A region $P_1$ is assigned to a certain node. A region $P_2$ is assigned to another node. A region $P_3$ is assigned to yet another node and region $P_4$ is assigned to still another node. In this embodiment of the present invention, in conformity with a subset of such intersections, the regions assigned to the respective individual nodes are also referred to as places. In one embodiment, one CPU serves for one place including about 100 intersections.

Figure 5:
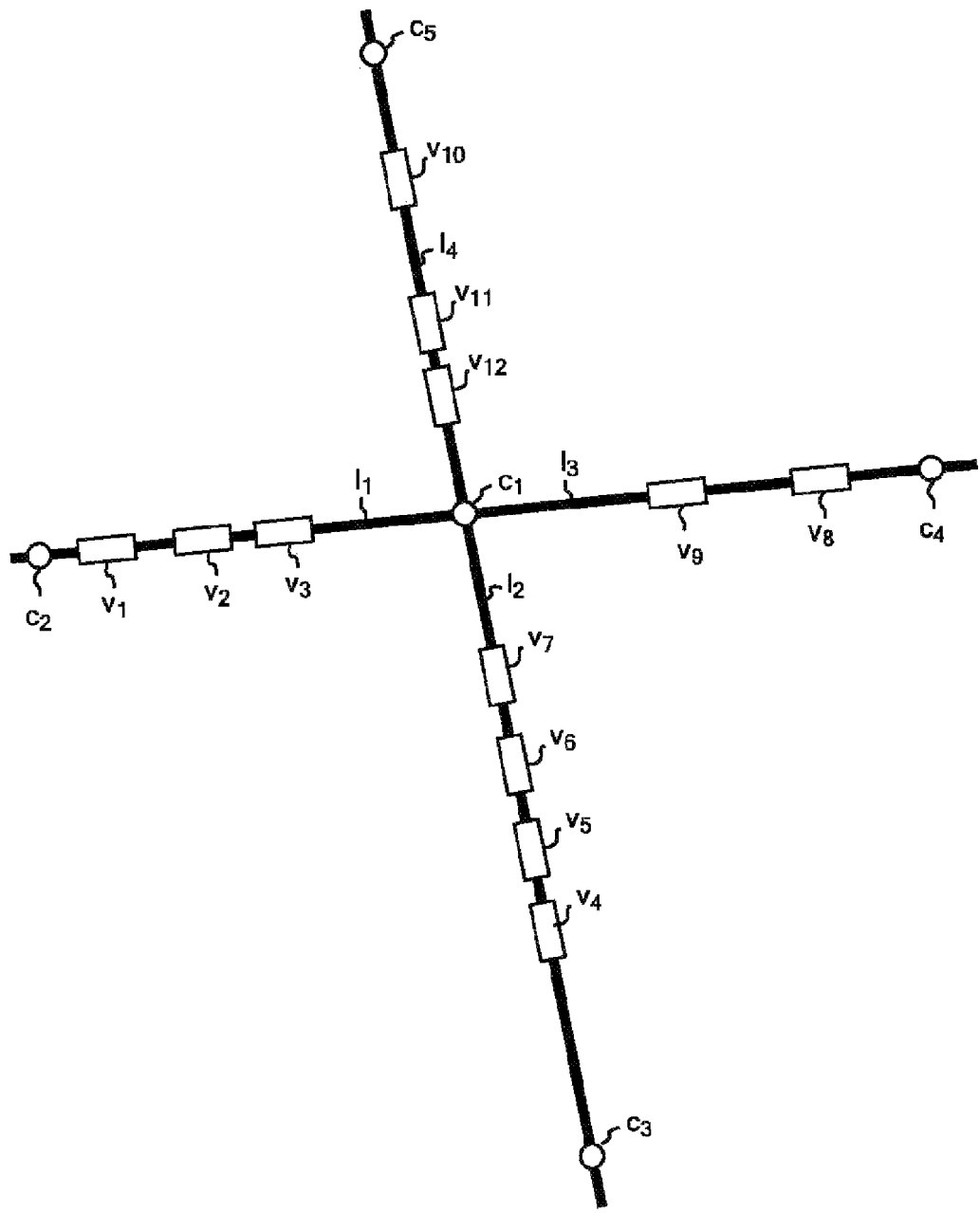
FIG. 5 is a diagram for illustrating the calculation for the filing rate at an intersection according to an embodiment of the present invention.

Next, referring to FIG. 5, an indicator, which is referred to as a filling rate and used in the present invention, is described. In FIG. 5: $c_1$, $c_2$, $c_3$, $c_4$ and $c_5$ denote intersections; $v_1$, $v_2$, $v_3$, $v_4$, $v_5$, $v_6$, $v_7$, $v_8$, $v_9$, $v_{10}$, $v_{11}$, and $v_{12}$ denote vehicles; and $l_1$, $l_2$, $l_3$ and $l_4$ denote the lengths of roads which are line segments separated by the intersections. The filling rate of the intersection $c_1$ is represented as $N_1/l_1 + N_2/$ $l_2+N_3/l_3+N_4/l_4$, which is acquired by dividing the number of vehicles on each road connected to the intersection $c_1$ by the length of the road.

Referring again to FIG. 2, the traffic simulation program 206 performs processes written as the following pseudo-code:

for (t=0; t<N; t=+Δt){
1. process vehicles entering each intersection, on all the intersections (position determination and movement of the vehicle)
2. process vehicles leaving each intersection on all the intersections (pass the vehicles to the next road object; migration, if a road exists on another road; path determination, if necessary)
3. wait for completion of processes on all the intersections, synchronization is established (global synchronization on the intersections in all the nodes)}
(t denotes simulation step, N denotes the total number of simulation steps, and Δt denotes a value by which the step proceeds).

Here, in one embodiment of the present invention, if there is no vehicle in front of the vehicle, the vehicle travels at a velocity substantially equivalent to the speed limit for the road and thus moves on the road. If there is a vehicle in front of the vehicle, the velocity is reduced so as to keep an appropriate vehicle and updates the position of the vehicle on each step. Without limitation thereto, another vehicle movement simulation algorithm can be used.

The filling rate calculation routine 208 calculates the filling rate on each intersection in the map data 204 on the basis of pieces of the map data 204 and the output of the traffic simulation program 206. The definition of the filling rate here is as described above. If calculation of the filling rates of all the intersections in the map data 204 is too heavy in terms of computational complexity, weights can be preliminarily assigned to the respective intersections and only the filling rates of intersections having at least a certain threshold can be calculated on the basis of the centrality in the graph theory. Betweenness, which is the number of paths that cannot be reached without through apices, can be used as the centrality in this case.

The sorting routine 210 sorts the intersections in the map data 204 according to the filling rate calculated by the filling rate calculation routine 208 in a descending order, selects top N (N is 1000 in one embodiment and N is a prescribed natural number), and supplies the routine 212 for calculating the number of steps with the selected intersections together with information on the places to which the intersections belong.

The routine 212 for calculating the number of steps calculates the filing rate d, which is the total of the filing rates of the top N intersections received from the sorting routine 210, according to the following expression:

[Expression 1]

$$d = \sum_P \sum_{r \in C} \frac{N_r}{l_r} \quad (1)$$

(where, $N_r$ is the number of vehicles on each road, $l_r$ is the length of each road, P is the set of places, and C is the set of roads connected to intersections which are objects in each place P).

After d has been acquired, the routine 212 for calculating the number of steps calculates the number of steps Δt of the traffic simulation program 206 according to the following expression:

[Expression 2]

$$\Delta t = \frac{N_C P N_v}{d^2 T} \quad (2)$$

(where, P is the number of places, T is the number of steps in the entire simulation, $N_C$ is the number of intersections which are objects in the entire simulation, and $N_v$ is the number of vehicles traveling in the simulation).

If the number of steps Δt, which is the calculated result, is larger than a certain threshold, the numbers of steps Δt calculated in previous n times (e.g., 20 times) can preliminarily be stored and the value acquired by averaging the numbers can be output. Thus, an abrupt increase in the number of steps Δt can be attenuated.

If the number of steps Δt, which is the calculated result, is smaller than the threshold, a predefined prescribed constant can be output as the number of steps Δt. Thus, an abrupt increase in the number of steps Δt can be attenuated.

The number of steps Δt determined as described above is supplied to the traffic simulation program 206 and used to advance the step of the simulation.

Figure 3:
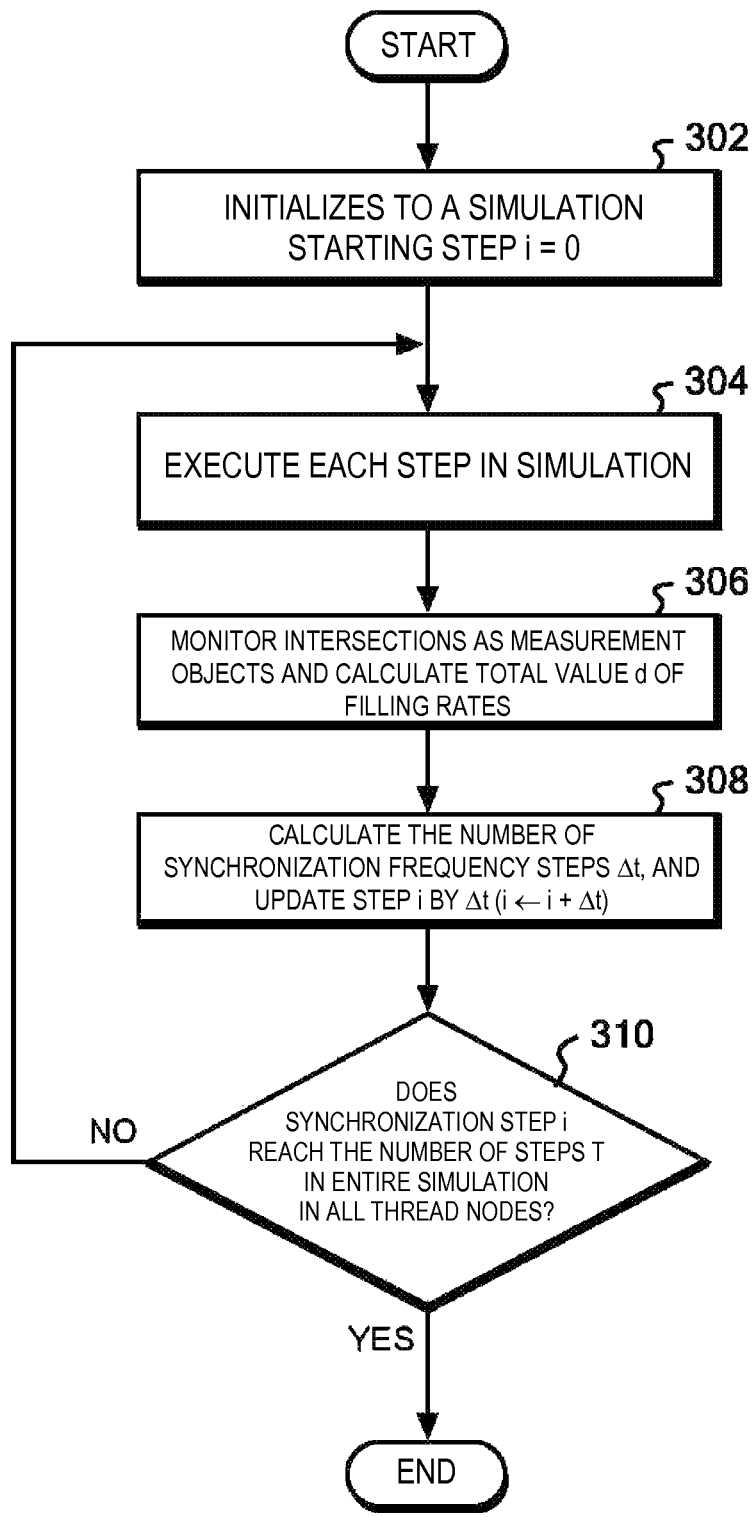
FIG. 3 is a flowchart of processes according to an embodiment of the present invention.

Next, referring to the flowchart of FIG. 3, the operations of the traffic simulation according to an embodiment of the present invention is described.

In step 302 in FIG. 3, the main program 202 initializes the traffic simulation program 206 to a simulation starting step i=0. This process includes: assigning intersection information of the map data 204 as a place to each of the nodes, which are preferably CPUs; and providing the number of vehicles, the initial positions, and the initial velocities.

In step 304, the traffic simulation program 206 executes the step according to the provided setting. Since the process is preferably executed at each node as an individual thread, the node is also referred to as thread node.

In step 306, the filling rate calculation routine 208 monitors the intersections, which are measurement objects, in a state where the traffic simulation program 206 executes the step, and the sorting routine 210 sorts the intersections to thereby select top N intersections with respect to the filling rate. Through use of such information on top N intersections, the routine 212 for calculating the number of steps calculates the total value d of the filling rates according to the aforementioned Expression (1).

Subsequently, in step 308, the routine 212 for calculating the number of steps calculates the number of steps Δt according to the aforementioned Expression (2), that is, i←i+Δt; the step of the traffic simulation program 206 is advanced by Δt.

Subsequently, in step 310, the main program 202 determines whether synchronization reaches the entire number of simulation steps T in all the thread nodes or not. If it reaches, the processing is finished. If not, the processing returns to step 304.

The present invention has been described above on the basis of the specific embodiment. However, the present invention is not limited to the specific embodiment. Various modifications and replacements of configurations and techniques that one skilled in the art can obviously think of are applicable. For instance, the present invention is not limited to a specific processor architecture and operating system.

For instance, in this embodiment of the present invention, the number of steps of the simulation is calculated to be in inverse proportion to the square of the filling rate d. Instead, according to application examples, another function that is a monotonically decreasing function of the filling rate d can be used.

In this embodiment, the region of the map used in the simulation is divided into the plurality of places, the places are assigned to the individual nodes. However, such a configuration is not necessary. It should be noted that, in the case of a certain size of the region in the map used in the simulation, a single CPU can cover all the processes.

I claim:

1. A computer implemented traffic simulation method for sequentially calculating the positions of a plurality of vehicles traveling along roads according to a time interval, wherein the computer includes a processor communicatively coupled to a memory, the method comprising:
   calculating a filling rate of an at least one vehicle at an intersection;
   selecting a plurality of top N intersections with respect to said filling rate;
   adding up a plurality of filling rates with respect to said plurality of top N intersections to get an added-up filling rate;
   calculating said time interval of a simulation by dividing the number of intersections as measurement objects× the total number of nodes×the number of vehicles in the entire simulation by a square of said added-up filling rate×the number of steps in the entire simulation;
   advancing said simulation at said calculated time interval; and
   outputting, to a display, updated positions of the plurality of vehicles according to said calculated time interval.

2. The computer implemented traffic simulation method according to claim 1, wherein said filling rate is calculated on the basis of a value acquired by dividing the number of vehicles along the road by a length of the road.

3. The computer implemented traffic simulation method according to claim 1, wherein said calculated time interval is set to a predetermined time interval in response to said calculated time interval being smaller than a first threshold time interval.

4. The computer implemented traffic simulation method according to claim 1, wherein said calculated time interval is set to an average of a number of previous calculated time intervals in response to the calculated time interval being larger than a second threshold time interval.

5. A non-transitory computer readable storage medium tangibly embodying a computer readable program code having computer readable instructions which, when implemented, cause a computer to carry out the steps of a method for calculating the positions of a plurality of vehicles traveling along roads in a traffic simulation according to a time interval, the method comprising:
   calculating a filling rate of an at least one vehicle at an intersection;
   selecting a plurality of top N intersections with respect to said filling rate;
   adding up a plurality of filling rates with respect to said plurality of top N intersections to get an added-up filling rate;
   calculating said time interval of a simulation by dividing the number of intersections as measurement objects× the total number of nodes×the number of vehicles in the entire simulation by a square of said added-up filling rate×the number of steps in the entire simulation;
   advancing said simulation at said calculated time interval; and
   outputting, to a display, updated positions of the plurality of vehicles according to said calculated time interval.

6. The computer readable storage medium according to claim 5, wherein said filling rate is calculated on the basis of a value acquired by dividing the number of vehicles along the road by a length of the road.

7. The computer readable storage medium according to claim 5, wherein said calculated time interval is set to a predetermined time interval in response to said calculated time interval being smaller than a first threshold time interval.

8. The computer readable storage medium according to claim 5, wherein said calculated time interval is set to an average of a number of previous calculated time intervals in response to the calculated time interval being larger than a second threshold time interval.

9. A traffic simulation system for sequentially calculating the positions of a plurality of vehicles traveling along roads according to a time interval, the traffic simulation system comprising:
   a memory;
   a processor communicatively coupled to the memory; and
   a main program module communicatively coupled to the memory and the processor, wherein the main program module is configured to perform the steps of a method comprising:
   calculating a filling rate of an at least one vehicle at an intersection;
   selecting a plurality of top N intersections with respect to said filling rate;
   adding up a plurality of filling rates with respect to said plurality of top N intersections to get an added-up filling rate;
   calculating said time interval of a simulation by dividing the number of intersections as measurement objects× the total number of nodes×the number of vehicles in the entire simulation by a square of said added-up filling rate×the number of steps in the entire simulation;
   advancing said simulation at said calculated time interval; and
   outputting, to a display, updated positions of the plurality of vehicles according to said calculated time interval.

10. The traffic simulation system according to claim 9, wherein said filling rate is calculated on the basis of a value acquired by dividing the number of vehicles along the road by a length of the road.

11. The traffic simulation system according to claim 9, wherein said calculated time interval is set to a predetermined time interval in response to said calculated time interval being smaller than a first threshold time interval.

12. The traffic simulation system according to claim 9, wherein said calculated time interval is set to an average of a number of previous calculated time intervals in response to the calculated time interval being larger than a second threshold time interval.

* * * * *